(12) United States Patent
Rogov et al.

(10) Patent No.: US 10,879,888 B2
(45) Date of Patent: Dec. 29, 2020

(54) METHOD FOR ACTUATING AT LEAST ONE SEMICONDUCTOR SWITCH, IN PARTICULAR IN A COMPONENT OF A MOTOR VEHICLE

(71) Applicant: Robert Bosch GmbH, Stuttgart (DE)

(72) Inventors: Rostislav Rogov, Stuttgart (DE); Thorsten Baumhoefer, Illingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/639,764

(22) PCT Filed: Aug. 9, 2018

(86) PCT No.: PCT/EP2018/071576
§ 371 (c)(1),
(2) Date: Feb. 18, 2020

(87) PCT Pub. No.: WO2019/034504
PCT Pub. Date: Feb. 21, 2019

(65) Prior Publication Data
US 2020/0186143 A1    Jun. 11, 2020

(30) Foreign Application Priority Data
Aug. 15, 2017   (DE) .................. 10 2017 214 217

(51) Int. Cl.
*H03K 17/18* (2006.01)
*H03K 17/0812* (2006.01)
(Continued)

(52) U.S. Cl.
CPC ... *H03K 17/08128* (2013.01); *G01R 19/1659* (2013.01); *H02M 3/158* (2013.01);
(Continued)

(58) Field of Classification Search
CPC combination set(s) only.
See application file for complete search history.

(56) References Cited

U.S. PATENT DOCUMENTS 5,828,245 A * 10/1998 Brambilla ............ H03K 17/163
                                                         327/108
6,906,574 B2 * 6/2005 Ohi ................... H03K 17/08128
                                                         327/392
(Continued)

FOREIGN PATENT DOCUMENTS

DE   102013001109   8/2013
EP   3076549   10/2016

OTHER PUBLICATIONS

International Search Report for Application No. PCT/EP2018/071576 dated Oct. 31, 2018 (English Translation, 2 pages).

*Primary Examiner* — An T Luu
(74) *Attorney, Agent, or Firm* — Michael Best & Friedrich LLP

(57) ABSTRACT

The invention relates to a method for actuating at least one semiconductor switch, in particular in a component of a motor vehicle. The at least one semiconductor switch can be switched with a control voltage (1) according to the following method steps: a1) specifying the control voltage (1) in a tolerance range (2) and a2) monitoring whether a control voltage (1) actually being applied to the at least one semiconductor switch exceeds at least one threshold (4, 5), wherein at least the following method step is carried out at at least one control time: b1) ascertaining a difference between the control voltage (1) actually being applied to the at least one semiconductor switch and the at least one threshold, the control voltage (1) specified according to step a1) being manipulated according to the at least one control time using the result from step b1).

9 Claims, 4 Drawing Sheets

(51) Int. Cl.
*H03K 17/16* (2006.01)
*G01R 19/165* (2006.01)
*H02M 3/158* (2006.01)
*G01R 31/327* (2006.01)
*G01R 31/40* (2020.01)

(52) U.S. Cl.
CPC .......... *H03K 17/168* (2013.01); *H03K 17/18* (2013.01); *G01R 31/3277* (2013.01); *G01R 31/40* (2013.01)

(56) References Cited

U.S. PATENT DOCUMENTS

| | | | |
|---|---|---|---|
| 8,008,953 B1 * | 8/2011 | Brumett, Jr. ......... | H03K 17/166 327/109 |
| 9,391,604 B2 * | 7/2016 | Barrenscheen ........ | H03K 17/28 |
| 2004/0027762 A1 | 2/2004 | Ohi et al. | |
| 2016/0018446 A1 | 1/2016 | Chen et al. | |

\* cited by examiner

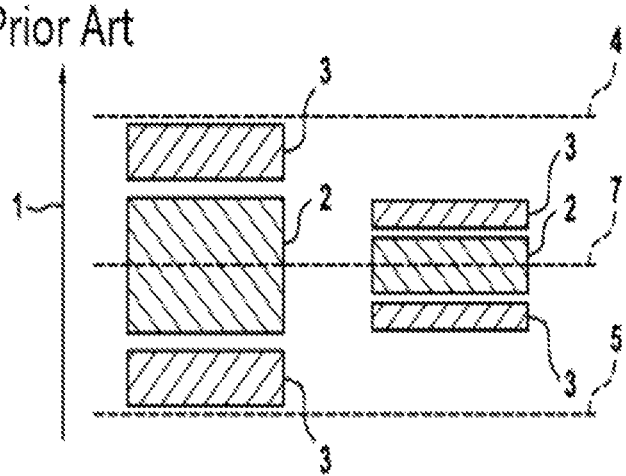
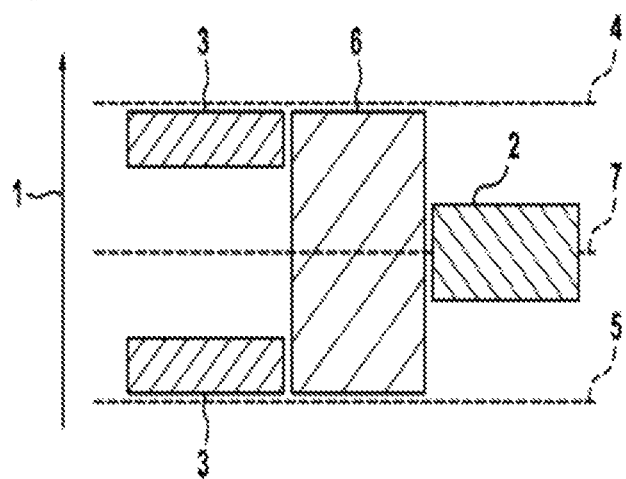

METHOD FOR ACTUATING AT LEAST ONE SEMICONDUCTOR SWITCH, IN PARTICULAR IN A COMPONENT OF A MOTOR VEHICLE

BACKGROUND OF THE INVENTION

In the case of motor vehicles with an electric drive, it is normal to supply drive motors with power via inverters. The inverters used for this typically have multiple transistors which can be actuated using appropriate control voltages. For safety reasons it is necessary that the actuation of the transistors is monitored. In particular, safety-critical malfunctions must be eliminated with particular reliability. This normally leads to particularly high demands on the transistors used, giving rise to particularly high costs.

Overvoltage cutouts are not tested with regard to the precise voltage conditions on the road in the driving cycle. But a gate surge voltage can cause immediate damage to the power semiconductors. The control voltages are defined once at the development stage as a compromise. This can lead to unnecessary performance penalties and deratings.

SUMMARY OF THE INVENTION

A particularly advantageous method is presented for actuating at least one semiconductor switch, in particular in a component of a motor vehicle.

The method described, in particular, allows a particularly reliable monitoring of the semiconductor switches. The requirements placed on the semiconductor switches in this case are relatively low, so that the use of the described method allows particularly inexpensive semiconductor switches to be used. In particular, by using the method described, the parts and development costs for the semiconductor switch can be reduced. In addition, in particular, both the design and the validation of the design for long-term effects can be simplified. This is the case, because a component supplier normally needs to draw theoretical conclusions or carry out experiments and then perform a corresponding circuit validation for unfavorable operating situations (worst-case scenarios). In addition, the present invention allows valuable information to be collected in the field on the topic of component control and long-term effects. Such data are of particular interest for statistical evaluation.

The semiconductor switches are preferably semiconductor transistors. In particular, the semiconductor switches can be high-power semiconductor switches (preferably so-called insulated-gate bipolar transistors, or IGBTs for short) or semiconductor switches based on silicon carbide (SiC). The semiconductor switches are preferably provided in an inverter of an electric vehicle or a hybrid vehicle as the component. But it is also possible that the semiconductor switches are also provided in an on-board DC-DC converter of an electric vehicle as the component. The component may also be, in particular, an inverter, such as a B6 bridge. The supply of appropriate drivers with which the semiconductor switches can be actuated can either be unipolar (with a positive voltage) or bipolar (with a positive and a negative voltage).

The described method can be used for monitoring one, more than one or all the semiconductor switches of the component.

The semiconductor switches can preferably be controlled by a voltage applied between gate and source. This voltage is referred to here as the control voltage. Alternatively, this voltage can also be referred to as the gate voltage. The specification of the control voltage to be used may be, in particular, the result of development work. In this case, the control voltage to be used can be selected, in particular, as a compromise between particularly good performance, particularly good availability, a particularly long semiconductor service life expectancy, and/or particularly low driver and/or semiconductor costs. In particular, the ISO 26262 standard is preferably observed for functional safety.

The specification or the output of a control voltage for a semiconductor switch is referred to here as actuation of the semiconductor switch.

According to the steps a1) and a2) of the described method, at least one semiconductor switch can be switched. To this end, in step a1) a control voltage is specified in a tolerance range.

The control voltage may be specified, in particular, by an appropriate voltage source, such as a DC-DC converter. The voltage source preferably has a digital design. Alternatively, however, it is also preferable that the voltage source has an analog design. The definition of the control voltages may be carried out, in particular, in such a way that the exact level of the specified control voltage is not known. Instead, all that is known is that the actually specified control voltage is within the specified tolerance range, which in particular can be given around a nominal value. The nominal value is preferably essentially chosen to be identical to a desired value for the control voltage which is actually being applied to the at least one semiconductor switch. By means of the method described, however, the nominal value can also be chosen, in particular, to be different from the desired value. This is preferably carried out in such a way that a deviation of the voltage output by the voltage source from the desired value is compensated, so that the control voltage actually applied to the at least one semiconductor switch is particularly close to the desired value.

It would be possible in principle to specify the control voltage exactly. But this is time-consuming and, in particular, can lead to high costs. The tolerance range, which in particular can also be referred to as a tolerance band, can be determined by a worst-case analysis, for example. This may take into account, in particular, long-term and/or aging effects in DC-DC converters (such as a drift of the DC-DC voltage reference over the service life of the DC-DC converter). Preferably, the tolerance range is determined in such a way that the specified control voltage is not outside of the tolerance range at any time (in particular also over an entire service life of a corresponding DC-DC converter) nor under any conditions (i.e. in particular at any operating point).

In step a2) of the described method it is monitored whether a control voltage actually being applied to the at least one semiconductor switch exceeds at least one limit value.

The actually applied control voltage may be composed in particular of the control voltage specified in accordance with step a1) and other components, such as invalid voltages. This means that the actually applied control voltage can also exceed the at least one limit value even if (which is preferred) the at least one limit value is outside of the tolerance range of the specified control voltage.

The greater the uncertainty as to the control voltage actually applied to the at least one semiconductor switch, the larger the range for the semiconductor switch must be chosen in which the latter can be operated reliably. The larger this range is, the more expensive the development and/or production of the semiconductor switch can be. With the described method it is possible, in particular, to choose this range to be particularly small, so that particularly inexpensive semiconductor switches can be used.

In particular, so that the uncertainty as to the control voltage actually applied to the at least one semiconductor switch (which in addition to the control voltage specified in accordance with step a1) can also include in particular other components) can be kept particularly low, in accordance with the described method a step b1) is carried out at at least one control time. In step b1) a difference between the control voltage actually applied to the at least one semiconductor switch and the at least one limit value is ascertained. As a result, in particular a relative deviation of the actually applied control voltage from the at least one limit value can be ascertained. In particular, this does not involve an absolute determination of voltage values, for example in comparison to a fixed reference potential. Such a comparison could be particularly time-consuming and expensive.

The at least one control time is located preferably immediately after the motor vehicle is started up. Additional control times, for example at regular intervals during operation of the motor vehicle, are possible.

In the context of the described method the control voltage, in particular, can also be diagnosed. In particular, the diagnosis can consist of successively collecting data sets at various operating points. An operating point is preferably defined by at least one (preferably more than one) of the following parameters:

the inverter operating mode (standby, clocked mode),
the driver switching frequency (if clocked),
the digitized control variable of the converter (usually the duty cycle) "factory setting" without manipulation,
the digitized control variable of the converter for which the overvoltage fault was reported,
the digitized control variable of the converter for which the undervoltage fault was reported,
information that could complement the data set,
digital value as a model of the gate supply voltage (often available via the auxiliary winding), and
temperature (coolant, PCB).

The diagnosis can be correlated with other voltage measurement points already existing on the module. In particular, a comparison can be made between high-side and low-side supply voltages.

The software knows the real monitoring limits and where the applied control voltage or the operating point are relative to these real monitoring limits.

For example, the software can store three duty-cycle values which belong to an operating point (9 kHz PWM switching mode). 410 corresponds to the 41% duty cycle and factory setting, 360 to 36% and undervoltage fault, and 520 to 52% and overvoltage fault. The data can be processed internally in the car in the basic expansion stage, in the higher expansion stage the data can be transferred to stationary servers (for example, via a cloud), which would enable an intelligent data analysis and a comparison with other measurement data (in particular in the context of Big Data).

According to the at least one control time the control voltage specified in accordance with step a1) is manipulated using the result of step b1). Using the method therefore, a semiconductor switch is actuated with a control voltage that may have been manipulated.

Due to the manipulation the control voltage actually applied to the at least one semiconductor switch can, in particular, be particularly close to a desired value. In particular, the desired value can be chosen so that at this value a particularly reliable and safe switching of the at least one semiconductor switch can be carried out. In particular due to the manipulation, a particularly low uncertainty as to the actually applied control voltage can be achieved.

The manipulation may be carried out, in particular, relative to the at least one limit value. In particular, the manipulation need not be aimed at producing a fixed reference potential, which could be particularly time-consuming.

In particular, the manipulation according to the method described thus differs from a case in which a control voltage is specified with a very small tolerance range. In accordance with the described method, the control voltage can be specified with a relatively large tolerance range, wherein by means of the manipulation a particularly low level of uncertainty as to the actually applied control voltage can nevertheless be achieved. In this way, the method described can allow the same circuit to provide a nominally narrower tolerance range. In particular, a mere regulation of a voltage should not be regarded as manipulation.

In particular, the manipulation can be carried out by changing a nominal value for a voltage source that provides the control voltage. This means, in particular, that due to the manipulation the nominal value of the voltage source no longer corresponds to the desired value for the control voltage that is actually applied. In particular, the nominal value for a DC-DC converter (which in particular can exist as a digital control variable) can be changed. Preferably, the manipulation is carried out incrementally, for example in 100 mV steps. In particular the manipulation can be carried out until a corresponding exceedance of a limit value has been detected. Preferably, the manipulation is carried out digitally. For this purpose, in particular, digital electronics can be used. In particular, the manipulation can be carried out by means of a piece of software. Thus, for example, a piece of software can be used to intervene in a control loop of a voltage-generating converter stage. A duty cycle is preferably defined by a piece of software.

The method described can also exist, in particular, in the following embodiments. The embodiments specified here may complement, in particular, any of the respectively preceding embodiments.

This means that the complexity increases from one embodiment to the next.

in a first embodiment the control voltage is adjusted gradually in the full monitoring range, e.g. in 100 mV steps. This can be carried out, in particular, for diagnostic purposes, with no application taking place in the IGBT switching mode.

in a second embodiment the control voltage is adjusted (statically and/or dynamically in the IGBT switching mode), for example, to compensate for long-term effects in a third embodiment, the tolerance ranges are reduced and moved closer to each other, because the worst-case analysis on the circuit level no longer includes the long-term effects.

in a fourth embodiment, the permissible monitoring limits are narrowed, a deliberate overlap being created between the theoretical tolerance ranges. The costs of the theoretically violated availability can be offset by the real savings made in terms of semiconductor parts and development costs.

In a preferred embodiment of the method, in step a2) an upper limit value above the tolerance range and a lower limit value below the tolerance range are monitored.

The upper limit is preferably set such that the semiconductor switch can be operated safely at least below the upper limit value, wherein in particular no damage occurs to the semiconductor switch. In the case of a control voltage above the upper limit (for safety reasons, preferably even only above a value some distance above the upper limit value), damage may be caused to the semiconductor switch.

The lower limit value is preferably set such that the semiconductor switch can be switched safely at least above the lower limit. In the case of a control voltage below the lower limit (for safety reasons, preferably even only below a value at some distance below the upper limit value), a malfunction of the semiconductor switch may occur.

In another preferred embodiment of the method, the at least one limit value is clear of the tolerance range by at least a safety margin.

In the present embodiment, in particular the requirements of the ISO standard 26262 may be satisfied. Although the control voltage specified in step a1) may preferably not be outside the tolerance range, at least in the context of a worst-case analysis, external influences may additionally apply (such as external voltages that are added to the control voltage). External influences can occur, in particular, in the form of so-called latent errors. Although the control voltage specified in accordance with step a1) in accordance with the theoretical worst-case allowance cannot exceed the tolerance range in normal operation, the safety margin may be necessary to provide functional safety. The safety margin is preferably 1 V to 2 V [Volt], in particular 1.5 V.

In another preferred embodiment of the method, in step a2) a respective monitoring range is monitored for the at least one limit value.

The exceedance of the at least one limit value may be monitored, in particular, with associated electronics, for example on a single chip. In particular, the electronics can be designed in such a way that an action (for example, disconnection of the control voltage) is carried out when the control voltage exceeds the relevant limit value. In principle, it is possible that the electronics carries this out exactly, i.e. that the action will be performed as soon as the control voltage exactly exceeds the at least one limit value. For cost reasons however, it is preferred that the action is carried out at a value for which it is only known that it lies within the appropriate monitoring range. The electronics is therefore preferably designed such that the appropriate action is carried out upon passing a value which is not known precisely, but which is at least within the respective monitoring range.

In another preferred embodiment of the method the monitoring ranges and the tolerance range are arranged to be non-overlapping.

The at least one semiconductor switch is preferably designed, in particular, in such a way that a safe switching between the upper limit value and the lower limit value is possible without damaging the semiconductor switch. The closer the upper limit and the lower limit value are to each other, the more simply and cheaply the semiconductor switch can be designed. Accordingly, it is preferable that the monitoring ranges corresponding to the limit values are particularly close together. In principle, however, the possible interval between the monitoring ranges is defined by the width of the tolerance range of the voltage source for the control voltage if a particularly high reliability is required. If the monitoring ranges overlap with the tolerance range, then in principle it can occur that the action to be triggered during the monitoring (for example, shutting down the control voltage) is performed in normal operation. It is particularly important to exclude this possibility in normal operation for reliability reasons. For example, it might otherwise happen that a drive motor of a motor vehicle is suddenly switched off without an actual problem being present.

Accordingly, in this embodiment it is provided that the monitoring ranges do not overlap with the tolerance range. However, the method described can also allow overlapping of the monitoring ranges and the tolerance range without the fundamental problem described above occurring.

To achieve this, in another preferred embodiment of the method it is provided that the monitoring ranges and the tolerance range partially overlap.

Due to the manipulation of the control voltage it is possible, in particular, to ensure that the actually applied control voltage never falls in a monitoring range even despite overlapping of the monitoring ranges with the tolerance range. This is due to the fact that a nominally narrower tolerance range can be achieved by means of the manipulation.

In another preferred embodiment of the method the difference between the control voltage actually being applied and the at least one limit value in step b1) is ascertained by the fact that the control voltage specified in accordance with step a1) is manipulated to the extent that the exceedance of the at least one limit value is detected according to step a2).

The manipulation of the control voltage may be carried out in accordance with the described method, on the one hand in particular according to the control time (preferably continuously), which allows the control voltage to be brought particularly close to a desired value. On the other hand, the manipulation of the control voltage can also be carried out at the control time (preferably once or at a plurality of discrete control times), in order to ascertain the difference between the control voltage actually being applied and the at least one limit value in accordance with step b1). In both cases (i.e. both for the preferably continuous manipulation and for the manipulation preferably carried out once or at a plurality of discrete control times), however, the manipulation can also be carried out in the same manner, in particular by changing the nominal value of a voltage source.

In step b1), the control voltage is preferably manipulated in such a way that the at least one limit value (preferably all limit values, in particular the upper limit and the lower limit value) is exceeded. If there is more than one limit the control voltage is preferably manipulated over a corresponding range, so that the limit values are exceeded (one after another).

The low-valued violation of the limit values is carried out deliberately in step b1). In doing so it can be determined, in particular, what extent of manipulation is required in order to exceed a certain limit value. The extent of the manipulation can be, in particular, the difference to be determined between the control voltage actually being applied and the corresponding limit value.

This present embodiment, in particular, allows the test coverage to be increased. Thus, in particular, an overvoltage cutout can be individually tested in every motor vehicle (and not only in prototypes). Also, the control voltage actually applied to the at least one semiconductor switch can be individually selected for each motor vehicle (and not merely as a compromise for an entire vehicle series).

Therefore, in particular long-term effects can be compensated, for example in a set of electronics for monitoring the violation of the at least one limit value and/or in a DC-DC converter which specifies the control voltage in accordance with step a1). For example, aging effects such as a drift in the DC-DC voltage reference over the lifetime of the DC- DC converter can lead to an offset in the gate voltage of several hundred millivolts. This can be compensated with the described method.

The method described can also be used to compensate for short-term effects (such as a temperature influence). The short-term effects can in particular be learned with the method described and/or known from other sources. In accordance with the method described above, it can be learned, in particular, that at an extremely high temperature and at a specific operating point the control voltage drifts significantly in a particular direction. For the compensation, the control voltage can be manipulated thereafter in such a way that this moves closer to the desired value.

The control voltage actually being applied to the at least one semiconductor switch can thus be brought particularly close to a desired value for the control voltage specified in accordance with step a1).

This means that due to an optimal switching of the semiconductor switch, in particular energy losses can be reduced and a range of the motor vehicle can be extended, for example.

In another preferred embodiment of the method, in step b1) the control voltage is manipulated over a range between an upper limit value and a lower limit value.

In this embodiment it can be determined, in particular, at the control time, how large a relative interval exists between the upper limit value and an actually applied control voltage and between the lower limit value and the actually applied control voltage.

Then, according to the control time, for example, a manipulation can be carried out to the effect that the actually applied control voltage is in the middle (or at another value specified relative to the limits) between the upper limit value and the lower limit value.

In particular, in this embodiment it is possible to determine the range within which the control voltage (at least under present conditions, such as a temperature or an operating point, and also against the background of long-term effects such as an aging of a voltage source) can be safely adjusted. In particular, this range can be defined by the actual limits at which a monitoring of the monitoring ranges is actually triggered. With the present embodiment therefore, the real limits within which a manipulation is possible can be determined.

As a further aspect a control device is presented, which is configured for switching at least one semiconductor switch according to the method described. The particular advantages and design features described above for the method are applicable and transferable to the control device.

Furthermore, a computer program is presented, which is configured to perform all the steps of the described method. Moreover, a machine-readable storage medium is presented, on which the described computer program is stored. The particular advantages and design features described above for the method and for the control device are applicable and transferable to the computer program and the machine-readable storage medium.

Furthermore, the following embodiments of the described method are possible and, in each case, preferably individually or in combination with each other and/or with the previously described embodiments:

in one embodiment, a "calibration function" can be carried out. In this case a control variable can be adjusted to satisfy requirements for a system availability. In particular, a relative position of the control voltage relative to monitoring limits can be adjusted.

In one embodiment, a "performance function" can be carried out. In this case the control voltage can be increased to the highest permitted value in order, in particular, to reduce transmission losses. This can be carried out automatically, e.g. at high temperatures, but can also be carried out at the vehicle driver's request, for example, via a "performance switch".

In one embodiment, a "lifetime function" can be carried out. In this case, for example in semiconductors that are highly stressed over a product lifetime, the control voltage can be systematically lowered to prolong the service life.

In one embodiment, an "anomaly analysis" can be carried out, in particular in order to prevent defects. In this case, in particular, a drifting or movement of the monitoring limits may be diagnosed. An increased power consumption can also be diagnosed.

In one embodiment of the described method, a signal from a "Sport mode switch" can be processed before the method. Via a sport mode switch a driver can then decide for him/herself if he/she wants more performance at the expense of the semiconductor life expectancy and the short-circuit behavior. The background to this is that the transmission losses are lower (and hence more performance can be achieved), the short-circuit loading is higher (which is a risk) and the life expectancy is lower (which is also a risk), the higher the positive control voltage.

In one embodiment of the method a dynamic control voltage adjustment in each IGBT switching process can be used as the manipulation. For example, the control voltage can be lowered from 16V to 13V in the conducting state, to obtain a lower starting in the event of a short-circuit. The consequence is that the semiconductors do not need to be designed to be so robust against short-circuits. Before the next IGBT turns on, the control voltage is preferably raised again. However, this is only realizable with independent power supplies for each switch of a B6 bridge.

BRIEF DESCRIPTION OF THE DRAWINGS

Additional details regarding the invention and exemplary embodiments, to which the invention is not limited however, will be discussed in more detail with the aid of the drawings. They show schematically:

FIG. 4: two drawings of control voltages, which describe the prior art or the desire described in relation to the prior art, FIG. 5: a drawing of a control voltage according to a first embodiment of a method for actuating at least one semiconductor switch in a component of a motor vehicle.

DETAILED DESCRIPTION

Figure 1:
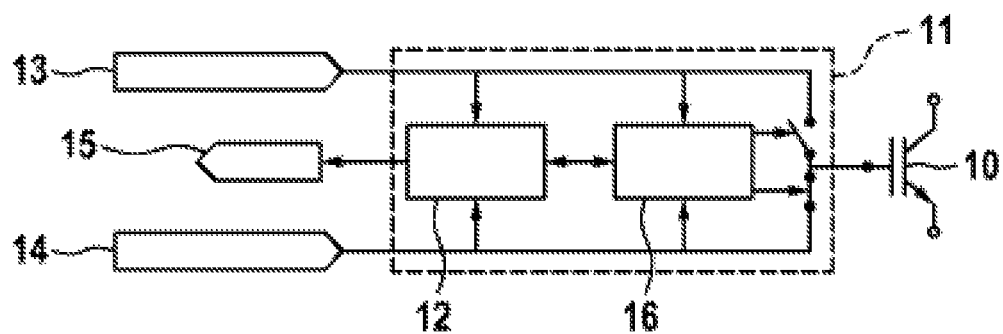
FIG. 1: a drawing of a first example of an IGBT actuation circuit.

FIG. 1 shows a drawing of a first example of an IGBT actuation circuit. In this case an IGBT 10 is actuated by a driver 11. The driver 11 comprises a monitoring circuit 12, which monitors a positive voltage 13 and a negative voltage 14 that are fed to the driver and, if necessary, outputs an error message 15. The driver 13 also comprises an actuation unit 16 for actuating the IGBT 10.

Figure 2:
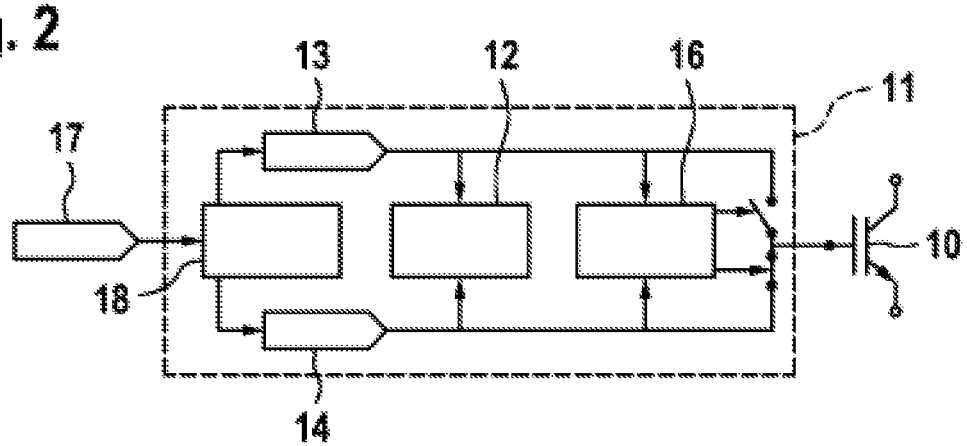
FIG. 2: a drawing of a second example of an IGBT actuation circuit.

FIG. 2 shows a diagram of a second example of an IGBT actuation circuit. Also shown here is an IGBT 10 with a driver 11. Here an input voltage 17 is specified for the driver 11. From this, in a DC-DC converter 18 a positive voltage 13 and a negative voltage 14 is obtained. In addition, the driver 11 has a monitoring circuit 12 and an actuation unit 16. In the IGBT actuation circuit shown in FIG. 2, in particular no communication takes place between the DC-DC converter 18 and the monitoring circuit 12. Therefore, in accordance with FIG. 2, in particular, no manipulation of a control voltage takes place using a result of a determination of a difference between an actually applied adjacent control voltage and a limit value.

Figure 3:
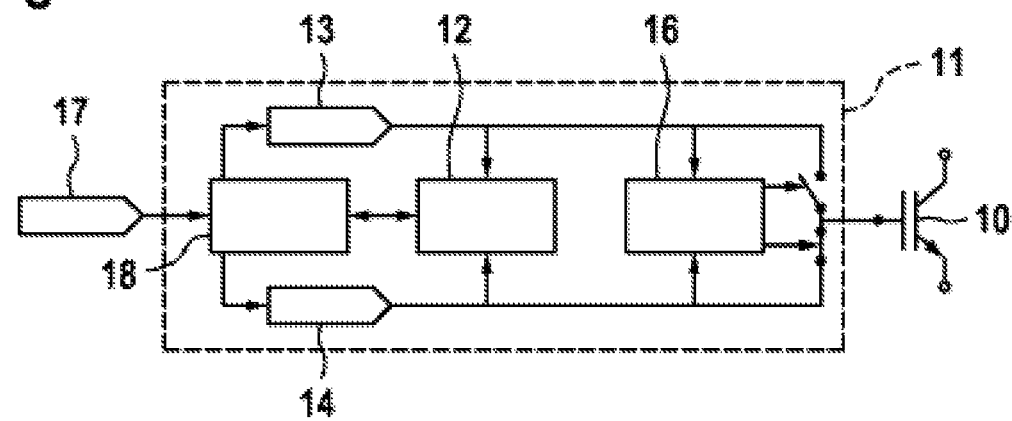
FIG. 3: a drawing of a third example of an IGBT actuation circuit.

FIG. 3 shows a drawing of a third example of an IGBT actuation circuit. The third example of the IGBT actuation circuit is based in particular on the second example shown in FIG. 2 as a starting point. In contrast to the second example, here a communication is provided between the DC-DC converter 18 and the monitoring circuit 12, which is indicated by an arrow.

Due to this communication, in particular, a manipulation of a control voltage can take place using a result of determining a difference between a control voltage actually being applied and a limit value in accordance with step b1) described above.

FIG. 4 shows two illustrations of a control voltage 1. The control voltage 1 is specified by a voltage source in such a way that the control voltage 1 lies within a tolerance range 2. The tolerance range 2 is arranged around a desired value 7 and lies between an upper limit value 4 and a lower limit value 5. Between the tolerance range 2 and the upper limit value 4, and between the tolerance range 2 and the lower limit value 5, a monitoring range 3 is provided in each case. The left and right drawing in FIG. 4 are distinguished by the width of the tolerance range 2 and the distance between the monitoring ranges 3.

In the left-hand representation in FIG. 4 the tolerance range 2 (i.e., the guaranteed supply band) is significantly greater than preferred.

The standard solution is to specify the fixed value of the control voltage once for the whole product life cycle in the development phase and to permanently monitor it for undervoltage and overvoltage. The monitoring is normally carried out by a voltage measurement built into the driver itself with permanently defined thresholds, which cannot normally be manipulated during the service life. The undervoltage function is usually tested by disconnection of the supply voltage in each driving cycle, wherein in particular a driver can signal a fault to a corresponding control device.

The typical desired arrangement from a development perspective is shown on the right in FIG. 4. The tolerance range 2 (i.e. the central band) here is significantly reduced compared to the left-hand representation of FIG. 4, e.g. to a width of 1 Volt.

The desired arrangement on the right in FIG. 4 can only be implemented with significant hardware costs, because it implies a compression of the tolerance ranges 2 for the modules involved. For the monitoring ranges 3 a more accurate voltage reference would be necessary in each monitoring circuit. A narrow tolerance range 2 would be a challenge in the DC-DC case. Statically, a high-precision voltage reference and accurate voltage dividers would be required. Depending on the design, this could mean high costs for analog or digital feedback transmission components (e.g. for opto-couplers). Dynamically, larger capacitances may be necessary in the event of load changes, which can also be associated with high costs.

FIG. 5 shows a diagram of a control voltage 1, which is manipulated according to a first exemplary embodiment of a method for actuating at least one semiconductor switch in a component of a motor vehicle. The monitoring ranges 3 are arranged as shown in FIG. 4. Also, the tolerance range 2 has the same width as in FIG. 4. However, at at least one control time a manipulation of the control voltage 1 takes place within a manipulation range 6. In doing so, the relative position of a control voltage 1 actually being output can be obtained in relation to the upper limit value 4 and the lower limit value 5 or, in particular, to the voltage values at which monitoring of the monitoring ranges 3 is actually triggered. By subsequent (continuous) manipulation the control voltage 1 can be brought particularly close to the desired value 7.

Figure 6:
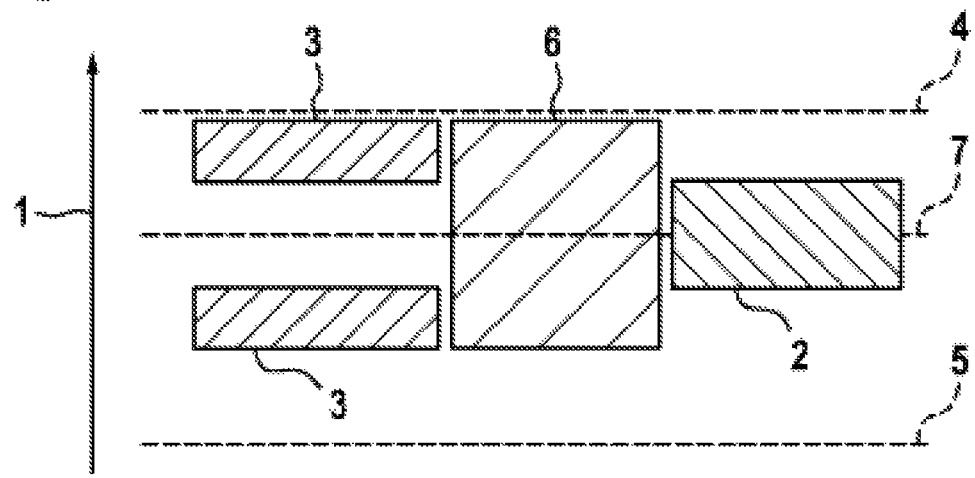
FIG. 6: a diagram of a control voltage according to a second embodiment of a method for actuating at least one semiconductor switch in a component of a motor vehicle.

FIG. 6 shows a diagram of a control voltage 1, which is manipulated according to a second exemplary embodiment of a method for actuating at least one semiconductor switch in a component of a motor vehicle. In contrast to FIG. 5 (and also in contrast to FIG. 4), the monitoring ranges 3 here are provided closer to one another. The monitoring ranges 3 here partially overlap with the tolerance range 2. Due to the (continuous) manipulation described for FIG. 5 above, it can nevertheless be ensured that the control voltage 1 never lies within the monitoring ranges 3.

Figure 7:
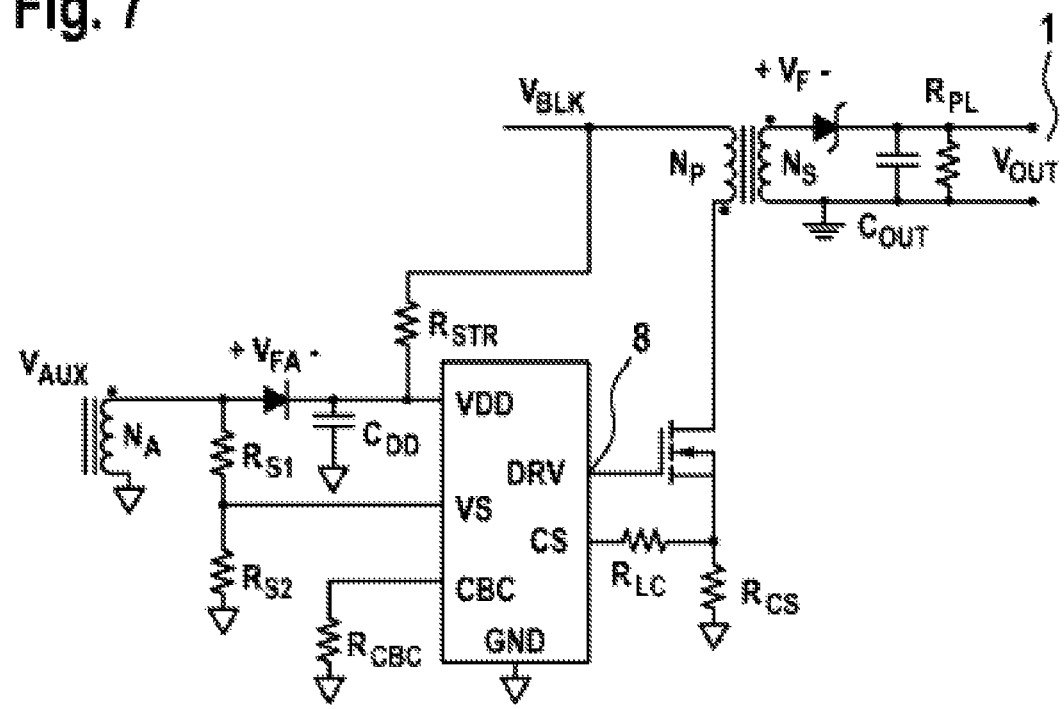
FIG. 7: a diagram of an electrical circuit for carrying out the method of FIG. 5 or 6, and FIG. 8: a flow diagram of the described method.

FIG. 7 shows an example of an electrical circuit, with which the manipulation in accordance with FIG. 5 or 6 can be carried out.

Figure 8:
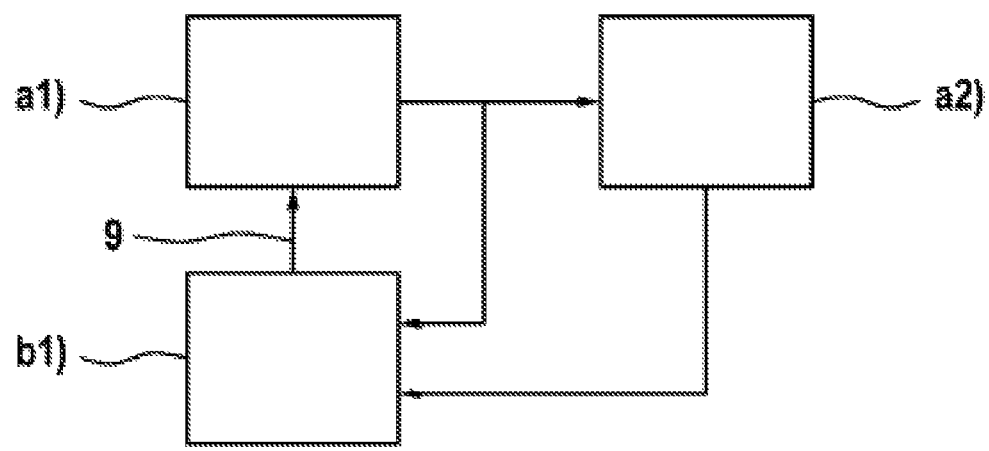

FIG. 8 illustrates the method steps that take place within the context of the method. The specification of the control voltage (step a1) in the tolerance range, and the monitoring of the actual voltage on the semiconductor switch resulting from this in relation to at least one limit value (step a2), are preferably carried out continuously.

Step b1) relates to ascertaining a difference between the control voltage actually applied to the at least one semiconductor switch and the limit value. Depending on the result of this difference a manipulation 9 of the specification of the control voltage is carried out (step a1).

The steps b1) and the manipulation 9 of the control voltage are preferably carried out at control times and hence not continuously, or at a lower repetition rate than the method steps a1) and a2).

The invention claimed is:

1. A method for actuating at least one semiconductor switch, wherein the at least one semiconductor switch is configured to be switched with a control voltage (1), the method comprising steps of:
   a1) specifying the control voltage (1) in a tolerance range (2), and
   a2) monitoring whether a control voltage (1) actually being applied to the at least one semiconductor switch exceeds at least one limit value (4, 5),
wherein at least the following method step is carried out at at least one control time:
   b1) ascertaining a difference between the control voltage (1) actually being applied to the at least one semiconductor switch and the at least one limit value (4, 5),
the control voltage (1) specified according to step a1) being manipulated according to the at least one control time using the result from step b1)
wherein the difference between the actually applied control voltage (1) and the at least one limit value (4,5) in step b1) is determined by manipulating the control voltage (1) specified in step a1) so that, in accordance with step a2), an exceedance of the at least one limit value (4,5) is recognized.

2. The method as claimed in claim 1, wherein in step a2) an upper limit value (4) above the tolerance range (2) and a lower limit value (5) below the tolerance range (2) is monitored.

3. The method as claimed in claim 1, wherein in step a2) a respective monitoring range (3) is monitored for the at least one limit value (4, 5).

4. The method as claimed in claim 3, wherein the monitoring ranges (3) and the tolerance range (2) are arranged to be non-overlapping.

5. The method as claimed in claim 3, wherein the monitoring ranges (3) and the tolerance range (2) overlap.

6. The method as claimed in claim 1, wherein the difference between the control voltage (1) actually being applied and the at least one limit value (4, 5) in step b1) is ascertained by the fact that the control voltage (1) specified in accordance with step a1) is manipulated to the extent that the exceedance of the at least one limit value (4, 5) is detected according to step a2).

7. The method as claimed in claim 6, wherein the control voltage (1) in step b1) is manipulated over a range between an upper limit value (4) and a lower limit value (5).

8. A control device configured for switching at least one semiconductor switch according to a method as claimed in claim 1.

9. A non-transitory, computer-readable media containing program instructions that when executed by a computer cause the computer to control at least one semiconductor switch, by:
- a1) specifying a control voltage (1) in a tolerance range (2), and
- a2) monitoring whether the control voltage (1) actually being applied to the at least one semiconductor switch exceeds at least one limit value (4, 5), wherein at least the following method step is carried out at least one control time:
- b1) ascertaining a difference between the control voltage (1) actually being applied to the at least one semiconductor switch and the at least one limit value (4, 5), the control voltage (1) specified according to step a1) being manipulated according to the at least one control time using the result from step b1)
wherein the difference between the actually applied control voltage (1) and the at least one limit value (4,5) in step b1) is determined by manipulating the control voltage (1) specified in step a1) so that, in accordance with step a2), an exceedance of the at least one limit value (4,5) is recognized.

* * * * *